Nov. 1, 1960 R. L. GARWIN 2,958,848

SWITCHING CIRCUIT

Filed Feb. 27, 1958 2 Sheets-Sheet 1

INVENTOR
RICHARD L. GARWIN

BY Paul McEnlow
ATTORNEY

United States Patent Office 2,958,848

Patented Nov. 1, 1960

2,958,848

SWITCHING CIRCUIT

Richard L. Garwin, Scarsdale, N.Y., assignor to International Business Machines Corporation, New York, N.Y., a corporation of New York Filed Feb. 27, 1958, Ser. No. 717,980

6 Claims. (Cl. 340—166)

This invention relates to gating and switching circuits of the cross point type, and more particularly to gating and switching circuits employing elements exhibiting superconductive characteristics.

Various materials are described as being superconductive when they are cooled to a temperature in the vicinity of absolute zero (0° Kelvin) whereupon the electrical resistance of the material becomes equal to zero. Materials such as niobium, tantalum, tin, lead, vanadium, aluminum and titanium, for example, becomes superconductive in the range of 0° K. to 8° K. The resistance of a superconducting material remains zero as a magnetic field is applied thereto until the field reaches a critical value, $H_c$. When the field is greater than the critical field value, the normal resistance of the material returns. The resistance reverts to zero when the field is lowered to a value less than $H_c$. The critical field value is a function of the characteristics and temperature of the material.

The prior art includes various electrical and electromechanical gating and switching devices of the cross point type wherein a plurality of input signals can be selectively applied to various output terminals. Switching devices of the cross point type generally employ a plurality of X and Y conductors orthogonally arranged as a matrix with a gating or switching element connected at the intersection of each X and Y conductor. By properly energizing the switching elements a signal applied to an X conductor, for example, can be directed to one or more of the Y conductors, or vice versa. A typical example of such devices is the familiar telephone crossbar switch.

In the known cross point type switching devices, the switching elements at the selected intersections must remain energized throughout a switching operation during which signals are being transmitted through the device. Hence, power must be expended continuously throughout the switching operation to keep the selected switching elements energized. The continuous expenditure of power can be eliminated by employing latching relays as the switching elements, but mechanical relays are frequently too slow for use in high speed electronic switching applications of the nature encountered in computing circuitry.

The present invention overcomes the disadvantages of slow switching speeds and the continuous expenditure of power by providing a cross point type switch employing switching elements fabricated of material exhibiting superconductive characteristics, each element being controlled by the magnetic field produced by a persistent current flowing in a superconductive path disposed adjacent thereto.

In the present invention each switching element is a superconductive link connected between a particular X conductor and a particular Y conductor. When the superconductive link is in the superconductive state, it exhibits zero resistance to current flow. When a link is rendered non-superconductive, it exhibits a resistance which may be as high as several thousand ohms and thus substantially reduces current flow therethrough. The magnitude of the resistance presented by the link, when in a non-superconductive state, is dependent upon the resistivity of the material of which the link is fabricated and the geometry of the link itself. By employing low impedance input and output stages, a signal may be transmitted from a particular X conductor to a particular Y conductor when the link connected therebetween is in the superconductive state. However, when the link is rendered non-superconductive, an input signal is not transmitted through the link.

The present invention utilizes the phenomenon of induced persistent currents which are induced in a closed current path fabricated from superconductive material to control the superconductive state of each link at an X and Y intersection. When a persistent current is flowing in a closed current path, a magnetic field is created about the path which is applied to the superconductive link. When the field is greater than the critical field value of the link, the link is rendered non-superconductive and the resistance thereof is altered from zero to its normal resistance. By eliminating the persistent current from the closed current path, the magnetic field decreases and when it reaches the critical value the link is restored to the superconductive state whereby the resistance thereof again becomes zero. Since each link is controlled by a persistent current flowing in a superconductive closed current path, no power is required to maintain the link in a particular state. In other words, when a closed current path is entirely superconductive, a current induced therein will persist since the resistance of the path is zero. A persistent current continues to circulate in a superconductive path without the continuous application of electrical energy thereto from an external source. A persistent current is eliminated from the closed current path only by rendering a portion of the path normal (non-superconductive) for a period of time sufficient to dissipate the current in a normal resistance of said portion of the path. Accordingly, since a closed current path fabricated of superconductive material may exhibit two states which are represented by the presence or absence of a persistent current therein, a link disposed adjacent a portion of the path may be made to exist in either the non-superconductive or the superconductive state, depending upon the presence or absence, respectively, of a persistent current in the closed path.

Where the continuous dissipation of power during the switching operation is not critical, the superconductive links at the XY intersections of the cross point switch may be controlled by other devices having the ability to selectively control the application of a magnetic field to the various links. All of the superconductive materials must of course be cooled to a temperature where the various materials each exhibit superconductive characteristics.

Initially, a persistent current is induced in each of the closed current paths adjacent each of the links of the switching device. Thus, each of the links of the switch are rendered non-superconductive so that signals cannot be transmitted through the switch. Thereafter, the persistent currents are eliminated in the closed current paths adjacent the links to be selected so that signals may be transmitted through the selected links. Accordingly, the switching speed of the invention is determined by the time required to induce or eliminate a persistent current in the closed current paths adjacent the selected links.

Accordingly, it is an object of the present invention to provide a novel switching device employing superconductive switching elements.

It is also an object to provide a novel switching device employing superconductive switching elements each of which is controlled by the presence or absence of a persistent current flowing in a superconductive loop disposed adjacent the link.

Another object is to provide a novel device employing superconductive elements for transmitting one or more input signals to one or more output terminals.

A further object is to provide a novel superconductive switching device having a switching time of the order of several millimicroseconds.

Another object is to provide a novel superconductive switching matrix for use in a high speed computer.

An additional object is to provide a superconductive device employing a plurality of superconductive switching conductors each of which is controlled by induced persistent currents.

It is also an object to provide a novel superconductive switching device comprising a plurality of conductors and links which are deposited, plated or evaporated on a suitable backing material.

Another object is to provide a novel cross point type switch employing a plurality of X conductors and a plurality of orthogonally oriented Y conductors and having a switching element fabricated of superconductive material connected between an X conductor and a Y conductor at each intersection of the various X and Y conductors, and means for controlling the superconductive state of each switching element independently.

A further object is to provide a novel superconductive switching device having a plurality of input terminals and a plurality of output terminals, a plurality of switching elements being provided whereby each input terminal can be connected to one or more of each of the output terminals, each said switching element comprising a superconductive link located adjacent a segment of a superconducting loop and means for inducing in and eliminating from each superconductive path a persistent current for controlling the superconductive state of each switching element.

Other objects of the invention will be pointed out in the following description and claims and illustrated in the accompanying drawings, which disclose, by way of example, the principle of the invention and the best mode, which has been contemplated, of applying that principle.

Figure 1:
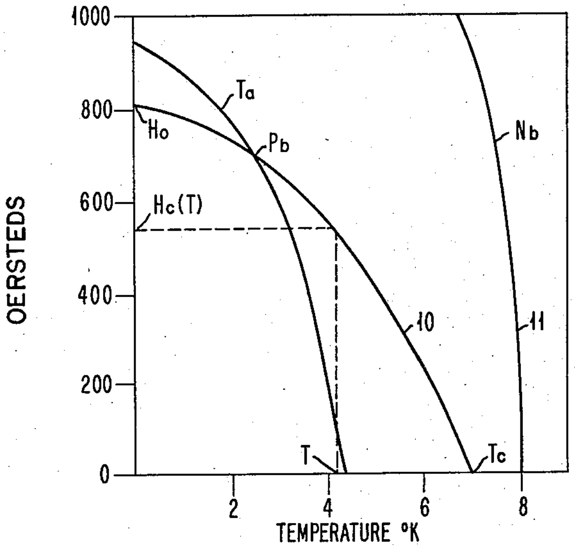
Fig. 1 is a plot of magnetic field vs. temperature for various materials exhibiting superconductive characteristics.

Referring more particularly to Fig. 1, a graph of magnetic field strength vs. temperature is shown for several superconductive materials. The transition curves for lead, niobium and tantalum are shown as curves 10, 11 and 12 which characterize the important properties of these superconductive materials. A material is said to be in a superconductive state when the relationship between the magnetic field applied to the material and the temperature thereof is such that the intersection of these values lies in the area beneath the curve (Fig. 1) corresponding to the material. However, if either the temperature or the magnetic field surrounding the material is increased so that the intersection of the temperature and field values occurs in the area above the appropriate curve, the material is said to be in the "normal state." For any superconductive material, the graph of transition temperature as a function of magnetic field is substantially parabolic and levels out as absolute zero is approached. While only a partial plot of the transition curve for niobium is illustrated in Fig. 1, the curve thereof would approach absolute zero if the scale of the Y axis were increased to approximately three times the magnitude illustrated.

Consider for example, that the superconductive material is lead and is cooled to temperature T indicated in Fig. 1. The material exists in a superconductive state only if the field applied thereto is less than the value $H_c(T)$. If the strength of the magnetic field is increased above the value $H_c(T)$, the material is transformed to the normal conductive state. The field strength $H_c$ corresponding to a particular temperature at which the transition from the superconductive to the normal state occurs, is called the critical field. It is apparent therefore, that when the temperature of a superconducting material is maintained at a constant value, the increasing and decreasing of the strength of the field controls the resistance of the conductor by causing the properties thereof to shift back and forth between its superconducting and normal states, respectively. In order to control the conductive state of a superconducting material by controlling the magnetic field, the temperature thereof must be maintained at a value less than the transition temperature $T_c$ corresponding to zero magnetic field.

It should be noted that the field strength plotted in Fig. 1 represents the total field produced by the current flowing through the superconductive material and any externally applied field. The critical magnetic field $H_c(T)$ corresponding to a particular temperature limits the current which can be passed through the material without destroying the superconductive state. The field strength of the self field at the surface of a cylindrical conductor, due to the current flowing therethrough, is equal to $2I_c/10r$, where $r$ is the radius of the wire in centimeters and $I_c$ is the critical current corresponding to the critical field $H_c(T)$.

When several superconducting elements are operated in the same vicinity, they are each responsive to different field strengths and thus the state of one element can be controlled by a magnetic field in the vicinity without affecting the superconductive state of other nearby elements having a higher critical field. Referring to curves 10 and 11 of Fig. 1, for example, it is clear that when the system is being operated at approximately 4° K., the critical field $H_c(T)$ sufficient to render a lead conductor normal, is insufficient to render a niobium conductor normal. This is true since the critical field for niobium at 4° K. is many times larger than the critical field for lead. Where various superconductive materials are utilized in the same vicinity and the materials have radically different critical field strengths, the field having the lower critical field is referred to as a "soft" superconductor, whereas the material having the greater critical field is referred to as a "hard" superconductor. In this connection, a magnetic field is generally applied to the system so as to render normal the "soft" superconductor without altering the superconductive state of the "hard" superconductor.

Frequently, a homogeneous alloy of two superconductive materials (or other compound superconductor) is used in order to provide a material having a predetermined critical field value. For example, a plot of the transition curve of tin would appear beneath curve 10 of Fig. 1. Thus a material having a predetermined intermediate critical field value can be formed by utilizing an alloy of tin and lead.

As explained hereinbelow, it is frequently desirable that a superconductive material exhibit a high resistance in its normal state. A higher resistance can be obtained by plating a superconductive material on a conductive plastic base. The increased resistance appears only when the material is normalized since it is shorted in the superconductive state by the zero resistance of the superconductive material. A high resistance may also be obtained by utilizing a thin film of superconducting material on an insulating base. The thin film may be evaporated or deposited by vacuum-metalizing techniques. Further, a high resistance may be obtained by removing the center of a superconducting conductor since the current in a superconducting element always flows in the surface thereof. Thus by plating or evaporating a thin film of lead, for example, on an insulating base, a higher resistance in the normal state is obtained due to the decreased cross section of the superconductive material.

As described hereinbelow, information may be represented by the superconductive or normal state of a superconducting material. For example, an element exhibiting superconductive characteristics may be arbitrarily said to be representing a binary 0 when it is in the superconductive state and representing a binary 1 when the material is in the normal state or vice versa. The information stored in a superconductive element can be determined by sensing the resistance of the element by any method well known in the art. If the material exhibits a zero resistance, it is of course, in the superconducting state, whereas when the material exhibits a resistance it is in the normal or non-superconducting state.

Further information concerning superconductive materials, theories of superconductivity and a synopsis of the experiments performed to date on superconductive materials may be found in the following references: D. Schoenberg, "Superconductivity," second edition, The Syndics of the Cambridge University Press, London, England, 1952; M. Von Laue, "Theory of Superconductivity," Academic Press, Inc., New York, New York, 1952; and D. A. Buck, "The Cryotron—A Superconductive Computer Component," Proceedings of the I.R.E., vol. 44, No. 4, pp. 482–493, April 1956. These references also include further references to literature relating to methods of obtaining temperatures near 4° Kelvin by apparatus using liquid helium or hydrogen.

Figure 2:
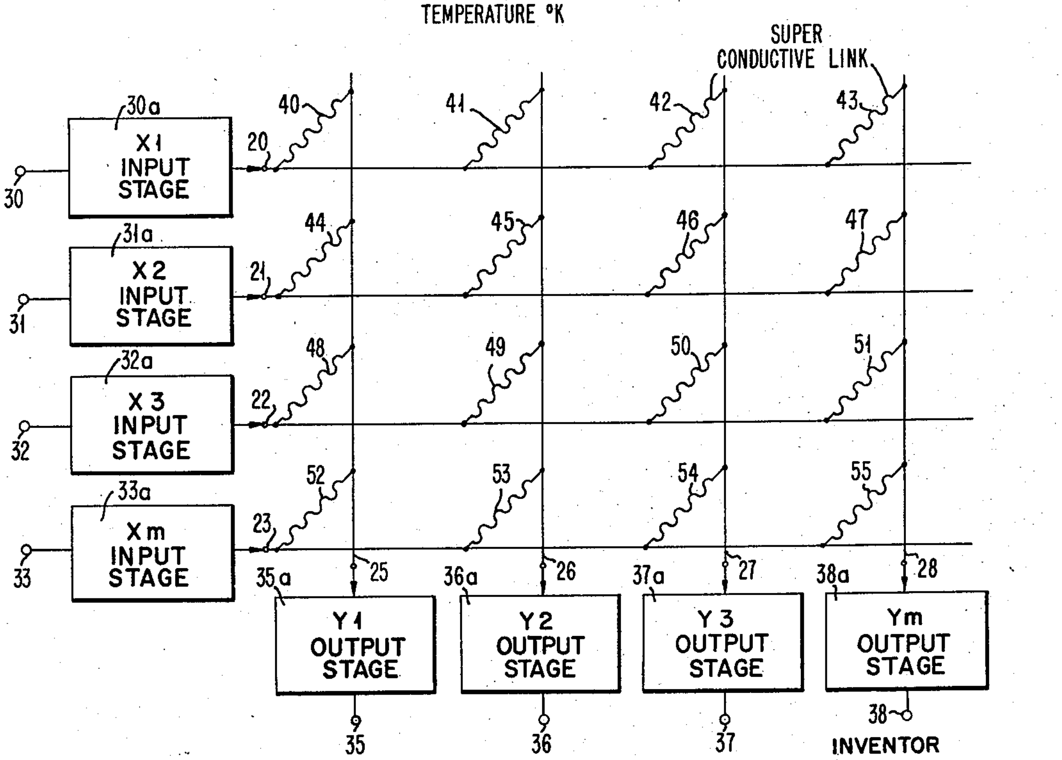
Fig. 2 is a schematic diagram of the invention.

Referring more particularly to Fig. 2, a schematic diagram of the novel cross point type switch employing switching elements exhibiting superconductive characteristics is illustrated. Fig. 2 illustrates only the signal circuits but does not show the means for controlling the switching elements. It is to be understood that all components of the circuit of Fig. 2 having superconductive characteristics must be maintained at a temperature sufficiently low to permit the realization of these characteristics.

The switching device of Fig. 2 includes a plurality of horizontal or X conductors 20–23 respectively corresponding to rows X1, X2, X3 and X*m*. A plurality of vertical or Y conductors 25–28 are also provided which respectively correspond to columns Y1, Y2, Y3 and Y*m*. The X and Y conductors are insulated from each other. Input terminals 30–33 are respectively coupled through input stages 30*a*–33*a* to the X conductors 20–23. The Y conductors 25–28 are respectively coupled by output stages 35*a*–38*a* to output terminals 35–38.

The X and Y conductors of Fig. 2 may be constructed of conventional electrically conducting materials such as copper, aluminum, etc., but preferably are fabricated from superconductive materials so as to take advantage of the zero resistance of the latter materials. The X and Y conductors may be fabricated as thin films or ribbons approximately $10^{-4}$ to $10^{-3}$ centimeters wide and may be approximately $10^{-5}$ centimeters thick, although other dimensions may be used. When the X and Y conductors comprise superconductive materials, such material must have a relatively large critical field value so that the conductors will always remain in the superconductive state even though magnetic fields discussed hereinbelow are created in the vicinity of these conductors. By utilizing conductors which always remain in the superconductive state, the resistance of the conductors is zero and therefore do not impede the transfer of current pulses through the switching elements described hereinbelow. The purpose of the X and Y conductors is to transmit current pulses to and from the various switching elements.

At the point where each Y conductor traverses an X conductor, a switching element, such as elements 40–55 of Fig. 2, is provided. Each switching element is electrically connected between an X and Y conductor. The switching elements are fabricated from a superconductive material having a critical field value which is substantially smaller than the critical field value of the X and Y conductors. Since the critical field value of each of the switching elements is smaller than that of the X and Y conductors, a particular switching element may be rendered normal, i.e., non-superconducting, by applying a magnetic field thereto having a field value greater than the critical field of the element. Due to the disparity between the critical field values of a switching element of the X and Y conductors, the application of a magnetic field to the switching element renders it normal without altering the superconductive state of the adjacent X and Y conductors.

Each of the switching elements may comprise a thin film or layer of superconductive material approximately $10^{-6}$ to $10^{-3}$ centimeters thick and approximately $10^{-4}$ to $10^{-3}$ centimeters wide. The superconductive switching elements or links are depicted in Fig. 2 by a wavy line indicating that the length of the superconductive links may be increased in order to increase the normal resistance of each link. By using alloys of various materials including a superconductive material to fabricate the links, the normal resistance of a link in the non-superconductive state can be made of several thousand ohms. Satisfactory links having a resistance in the vicinity of 9,000 ohms have been constructed.

The superconductive links of Fig. 2 may be used as switching elements by taking advantage of the fact that the links may exist in the superconductive state wherein zero resistance is exhibited or in the non-superconductive state where a resistance of several thousand ohms is manifested. When a particular link is in the superconductive state and thus exhibits a resistance of zero ohms, a current pulse can be readily transmitted therethrough without attenuation. However, when a link exists in the normal or non-superconductive state, the normal resistance thereof impedes current flow and thus may be utilized to inhibit the manifestation of an output pulse.

Referring to Fig. 2, assume for example, that a pulse is to be applied to input terminal 30 and is to be manifested at output terminal 35. In order to perform the switching operation of the example, all of the links 41 through 55 must be rendered non-superconductive and link 40 must exist in the superconductive state. Accordingly, the application of a pulse to input terminal 30 is applied by the X1 input stage to the X conductor 20. Since link 40 is in the superconductive state, the current pulse on X conductor 20 is applied through link 40 to Y conductor 25 and thence through the Y1 output stage 35*a* to output terminal 35. Each of the links 41, 42 and 43 are assumed, in the present example, to be in the non-superconductive state and thus impede current flow therethrough from X conductor 20 to the Y conductors 26, 27 and 28.

It is apparent from the above explanation that each of the input and output stages must be low impedance devices so that a resistance of several thousand ohms is much, much greater than the impedances to which each superconductive link is connected. Referring to the example described above, the impedance of the output circuit of the X1 input stage must be fairly low so as to cause a current pulse applied to X conductor 20 to produce a large voltage drop across any link connected thereto which is in the non-superconductive state. Similarly, the impedance of the input circuit of each of the output stages must be low compared to the value of the normal resistance of a switching element so that a pulse applied to a switching element in the normal state will be manifested primarily across the normal resistance of the switching element as opposed to the input impedance of the output stage.

For example, where the input and output stages employ transistors, the input stage may be an emitter follower type circuit of the type disclosed in application Serial No. 459,382, filed September 30, 1954, by G. D. Bruce et al., now Patent No. 2,888,578, dated May 26, 1959, entitled "Transistor Circuits," and the output stage may be a transistor connected in a grounded base type circuit. As a further example, each input stage may comprise a cathode follower circuit having a low output impedance and the output stage may employ a triode tube having a lower input impedance. In addition, the input and output stages may employ the switching element disclosed and claimed in application Serial No. 625,512, filed November 30, 1956, by Richard L. Garwin. The switching device of the latter application is basically a low impedance device which may have the center conductor thereof connected to the appropriate X conductors when employed as an input stage and having the outer control winding connected to the Y conductors when employed as an output stage.

With respect to Fig. 2, it is apparent that signals applied to one or more of the input terminals 30–33 may be applied to one or more of the output terminals by appropriately controlling the superconductive state of the various links 40–55. For example, a signal applied to input terminal 30 may be transmitted to output terminal 36 by requiring that link 41 be superconductive and a further input signal applied to terminal 33, for example, may be simultaneously transmitted to output terminal 37 by requiring that link 54 be superconductive. In the present example, the links 40, 42–53 and 55 must each be rendered non-superconductive.

Serial-to-parallel and parallel-to-serial conversions of the type frequently encountered in computing apparatus may be performed by the cross point switching circuit of Fig. 2 by selectively controlling the states of the various superconductive links. For example, a parallel-to-serial conversion may be effected when input signals are applied simultaneously to the input terminals by sequentially rendering the links 40, 44, 48 and 52, for example, superconductive. Therefore, the signals applied in parallel to input terminals appear in seriatim at the appropriate output terminal to provide the parallel-to-serial conversion. In a similar manner, a plurality of input signals applied serially to input terminal 30 may be sequentially gated to the various output terminals 35–38 by sequentially conditioning the links 40–43 as the input pulses occur on a timed basis.

It will be shown hereinbelow that the state of each of the links of Fig. 2 is controlled by the presence or absence of a persistent current flowing in a loop of superconductive material. When a current is flowing in a loop, a magnetic field is created therearound which may be applied to a link disposed adjacent to the loop. The magnetic field having a field strength greater than the critical field value of the link, renders the link normal whereby the latter exhibits its normal resistance. A loop for storing a persistent current is provided for each of the links and thus the transmission paths through the switch of Fig. 2 are controlled by determining which of the superconductive loops are storing persistent currents. Once a particular pattern of transmission paths through the switch of Fig. 2 is established by inducing persistent currents in each of the superconductive loops adjacent the links which are to be rendered normal, the pattern established remains indefinitely. Therefore, the cross point type switch of Fig. 2 may be employed as a programming device similar to the manner in which plugboards or patch channels are utilized in various present-day computers to determine the operation of a high speed computer associated therewith. Also, the device of Fig. 2 may be employed as a means for selectively connecting various elements such as tubes, transistors, cryrotrons, magnetic cores, etc., in various circuits to perform useful logical functions whereby the circuit connections may be readily changed by selectively controlling the state of the various links 40–55.

Figure 3:
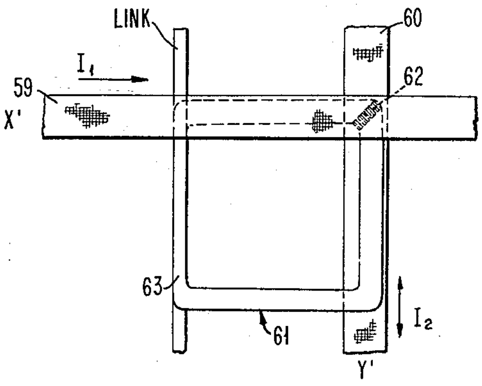
Fig. 3 illustrates structure for controlling a switching element of the invention.

As indicated hereinabove, in order to control the switching functions of the superconductive links 40–55 of Fig. 2, a loop of superconductive material is provided adjacent each link for storing a persistent current. When a persistent current is flowing in the loop of superconductive material, the magnetic field created by the persistent current is applied to the link associated therewith so as to render the link non-superconductive. The apparatus for controlling the superconductive state of a switching link of Fig. 2 is illustrated in Fig. 3 and the closed current path for storing an induced persistent current is more clearly illustrated in Fig. 4. The device of Fig. 3 for storing an induced persistent current is disclosed in application Serial No. 615,814 filed October 15, 1956, by Richard L. Garwin, and is incorporated herein by reference. Fig. 3 illustrates a closed current path for storing a persistent current which may be induced therein or removed therefrom by horizontal and vertical-select conductors. It is to be noted that the horizontal and vertical-select conductors of Fig. 3 are employed to establish or remove a persistent current in the closed current path of Fig. 3, whereas the X and Y conductors of Fig. 2 are employed for transmitting signal pulses.

In Fig. 3, the horizontal-select conductor 59 and the vertical-select conductor 60 are oriented orthogonally and are utilized to control the application of a magnetic field to the storage loop 61. Storage loop 61 is sandwiched between select conductors 59 and 60.

Figure 4:
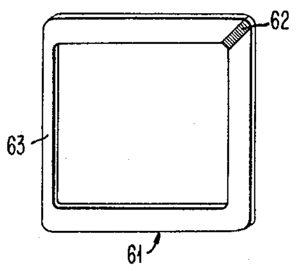
Fig. 4 depicts a superconductive loop for use in controlling a switching element of the invention.

Referring to Fig. 4, the superconductive storage loop is composed of two materials exhibiting superconductive properties which are arranged to form a continuous loop. The inset 62 of Fig. 4 is formed of a superconductive material having a lower critical field value than the remaining portion 63 of the loop. The superconductive material 62 is chosen to have a critical field value such that the material is rendered normal by the field produced by the coincidence of currents flowing in the horizontal and vertical-select conductors. The material 63 comprising the major portion of the storage loop is chosen to have sufficiently high critical field so that it always remains superconductive when coincident currents occur in the select conductors.

Regardless of the direction of current flow through the select conductors, inset 62 of the storage loop 61 is rendered normal whenever a coincidence of currents having proper magnitudes are flowing through the horizontal and vertical-select conductors. The normal resistance of inset 62 serves to dissipate any persistent current previously circulating in loop 61. The magnitude of the current applied to either the horizontal or the vertical-select conductor is chosen to produce a magnetic field which, by itself, is incapable of normalizing the inset 62.

The left-hand leg of storage loop 61 (Fig. 4) is substantially narrower than the top and right-hand leg which include inset 62. The width of the top and right-hand legs is determined by the field in inset 62 created by a persistent current circulating in the loop. That is, by increasing the width of a leg, the flux density decreases nearby and thus this width may be adjusted so that the flux density of the field created by a persistent current is always insufficient to render inset 62 normal. As stated above, inset 62 should be made normal only by the coincidence of select currents in conductors 59 and 60 of Fig. 3.

The reason that the width of the left-hand leg of loop 61 is substantially smaller than the remaining legs, is to provide an increased field created by a persistent current wherein said increased field surrounds only the left-hand leg. The smaller leg is always placed adjacent the link.

In Fig. 4, it is indicated that inset 62 is disposed as a section of loop 61. The inset 62 may also be formed by bonding a thin strip of superconductive material between two ends of the loop 61. The inset 62 follows the contour of the opening provided for the inset and may be fabricated by depositing a thin layer of superconductive material so as to overlap the ends of loop 61.

Figure 5A:
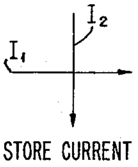
Figs. 5A and 5B show the required directions of the currents necessary for inducing and removing, respectively, a persistent current in the closed current path of Fig. 3.

A persistent current is induced in storage loop 61 of Fig. 3 by applying current $I_1$ to horizontal-select conductor 59 from left to right and applying current $I_2$ to vertical-select conductor 60 to flow downwards as depicted in the diagram of Fig. 5A.

When currents $I_1$ and $I_2$ are flowing in the directions indicated in Fig. 5A, a resultant magnetic field is formed immediately beneath the point at which the conductors cross which renders inset 62 normal. The normalization of inset 62 introduces its resistance which dissipates any persistent current previously circulating in the loop. The resultant field produced under the above circumstances is additive in the lower left-hand and upper right-hand quadrants formed by conductors 59 and 60 and is subtractive in the upper left-hand and lower right-hand quadrants. Since the fields produced by currents $I_1$ and $I_2$ are additive in the lower left-hand quadrant the resultant field provides a net flux flowing through the center opening of loop 61. Accordingly, at the termination of a STORE interval, the normalized inset 62 returns to the superconductive state when currents $I_1$ and $I_2$ are turned off. Since a net flux is present in the center opening of loop 61 when the entire loop becomes superconducting again, a current is induced in the loop which persists as long as the loop remains entirely superconducting. The current induced in the loop is proportional to the magnitude of the net flux passing through the center opening thereof.

Figure 5B:
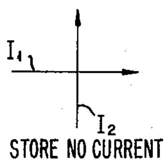

In order to store a binary 0, as represented by the absence of a persistent current in loop 61, current $I_1$ flows from left to right in conductor 59 and current $I_2$ must flow upwards through conductor 60 as depicted in Fig. 5B. The coincidence of currents $I_1$ and $I_2$ produces a resultant field which normalizes inset 62 as explained above to thereby dissipate any previously existing persistent current. However, since current $I_2$ is reversed in Fig. 5B, the resultant magnetic field is produced by additive fields (due to currents $I_1$ and $I_2$) in the upper left-hand and lower right-hand quadrants. The fields are subtractive in the lower left-hand and upper right-hand quadrants so that there is no net flux flowing through the center opening of loop 61.

Hence, a persistent current is not induced in loop 61 when currents $I_1$ and $I_2$ are flowing in the directions indicated in Fig. 5B since there is no net flux through the center opening of loop 61 at the time that the loop becomes entirely superconductive as $I_1$ and $I_2$ are turned off.

The directions of the currents $I_1$ and $I_2$ indicated in Figs. 5A and 5B have been chosen arbitrarily and it should be noted that a persistent current may be induced in the storage cell of Fig. 3 by reversing the direction of both of the currents indicated in Fig. 5A and that the absence of a persistent current may be stored by reversing the directions of both of the currents indicated in Fig. 5B.

If desired, inset 62 of Figs. 3 and 4 may be eliminated and the entire loop be composed of the same material. The operation of the loop to store a persistent current, in this case, is as described above. Here the portion of the loop beneath the select conductors is normalized by the coincident fields in the same manner as inset 62 is normalized.

It is to be understood that other apparatus for controlling the state of the switching links of Fig. 2 by the storage of a persistent current may be utilized without departing from the scope of the invention. For example, the switching devices illustrated in Figs. 2, 4, 5 and 6 of application Serial No. 615,814 referred to hereinabove, may also be utilized to control the state of the links. For example, where the storage loop of Fig. 2 of said application is utilized, the switching link would be located within inductance 19 of said Fig. 2. Where the storage devices of Figs. 4, 5 or 6 of said application are employed, the link would be located adjacent a portion of the storage loop 61 of said figures.

Figure 6:
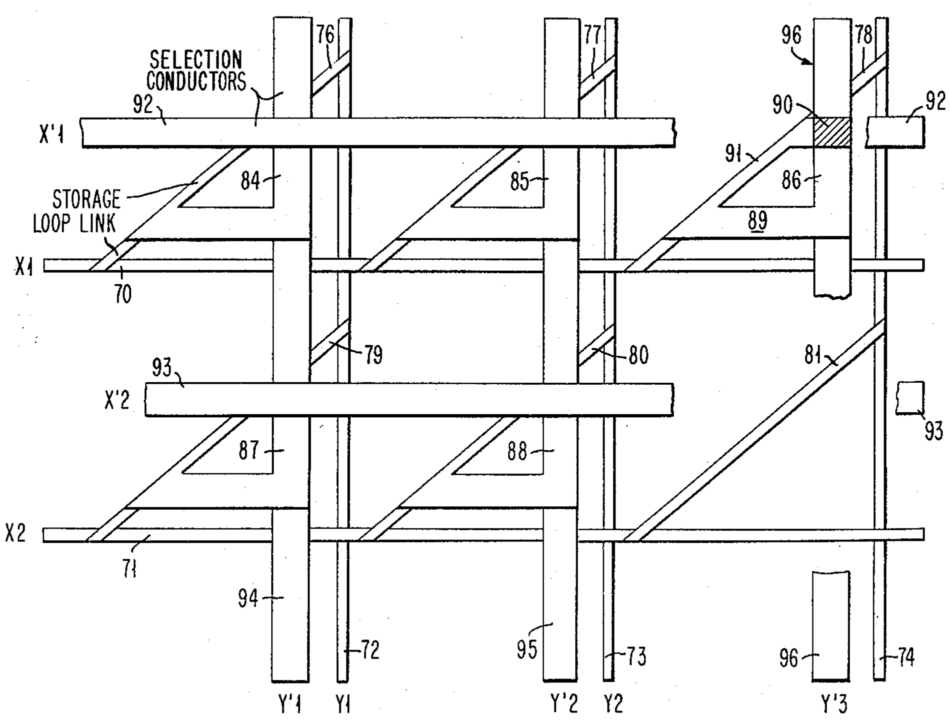
Fig. 6 illustrates the complete superconductive cross point switch controlled by persistent currents.

Referring more particularly to Fig. 6, an embodiment of the invention is illustrated which includes the X and Y conductors, the switching links and the persistent current loops for controlling the status of each link. The X and Y conductors carry signal currents which are generally substantially smaller than the selection currents flowing in the selection conductors. Thus the X and Y conductors are shown in Fig. 6 as being narrower than the selection conductors.

In Fig. 6, the X1 conductor 70 and the X2 conductor 71 correspond to conductors 20 and 21 of Fig. 2. Similarly, Y conductors 72, 73 and 74 of Fig. 6 correspond to conductors 25, 26 and 27 of Fig. 2. The X and Y conductors are, of course, insulated from each other. At each intersection of an X and a Y conductor, a link of superconductive material is provided which is connected to the respective conductors. In Fig. 6, the superconductive links are labelled 76–81. As stated previously, the material comprising the links 76–81 must have a critical field value substantially lower than the critical field value of the material comprising the X and Y conductors so that the normal rendition of a link does not alter the superconductive state of the adjacent X and Y conductors. Adjacent each of the links of Fig. 6 is a storage loop for storing a persistent current. Storage loops 84–88 are respectively associated with links 76–80. The storage loop associated with link 81 has been omitted in order to more clearly illustrate the structure of the invention.

A portion of Fig. 6 has been broken away in order to illustrate a suitable construction for the storage loops. For example, storage loop 86 is shown as comprising a first member 89 and a second member 90 which serve the same functions as members 61 and 62, respectively, of Fig. 4. In order to facilitate the diagonal placement of the links, such as link 78, the left-hand leg 91 is oriented obliquely to the lower leg of storage loop 86, although it is to be understood that the oblique arrangement of leg 91 is not a necessary feature of the invention. It is essential, however, for the proper operation of the switching matrix of Fig. 6, that the leg 91 be disposed adjacent the superconductive link which is to be switched from the superconductive to the normal state. As described hereinabove with respect to Fig. 4, the left-hand leg of the storage loop is narrower than the remaining legs of the loop so as to increase the strength of the magnetic field created around leg 91 when a persistent current is stored in loop 86. The inset 90 of loop 86 is constructed of material having a lower critical field value than the material comprising the remaining portion of the loop in order to facilitate the storage in or removal of a persistent current in the entire storage loop. The storage loops 80–88 of Fig. 6 are each controlled in the same manner as described hereinabove with respect to Figs. 3 and 4.

The inducing of a persistent current in the various storage loops of Fig. 6 and also the elimination therefrom of stored persistent currents is controlled by the $X^1$ and $Y^1$ selection conductors. Each of the $X^1$ selection conductors, such as 92 and 93, is placed adjacent the insets (similar to inset 90) of each of the storage loops of a given row. A $Y^1$ selection conductor, such as conductors 94, 95 and 96, is provided for each column of storage loops, and each $Y^1$ selection conductor is placed adjacent the insets corresponding to inset 90 of the storage loops comprising a particular column. In Fig. 6, each $Y^1$ selection conductor is illustrated as being located beneath the storage loops associated therewith, and the $X^1$ selection conductors are illustrated as being disposed over the storage loops. However, other arrangements of the selection conductors may be utilized so long as the proper field concentration can be applied to the loops associated therewith. The $X^11$ and $X^12$ selection conductors, as well as the $Y^3$ selection conductor are shown broken in Fig. 6 for purposes of more clearly illustrating the construction of the invention. However, it is to be understood that these conductors are to be continuous so as to embrace the storage loops associated with links 78 and 81.

Assume for example, that a persistent current is initially induced in each of the storage loops of Fig. 6 by the method described hereinabove with respect to Fig. 3. Accordingly, all of the $X^1$ and $Y^1$ selection conductors must be energized by currents flowing in the direction indicated in Fig. 5A. Since a persistent current is flowing in each of the storage loops associated with links 76–81 of Fig. 6, each of these links is rendered non-superconductive by the magnetic fields applied thereto which are created by the circulating persistent currents. Thus the normal resistance of a link appears in series between any X conductor and any Y conductor. Assume further for example, that an input signal applied to the X1 conductor 70 is to be transmitted to the Y2 conductor 73. In order to accomplish this switching operation, the link 77 must be rendered superconductive by eliminating the persistent current circulating in storage loop 85. As indicated hereinabove with respect to Figs. 3 and 5B, a persistent current circulating in loop 85 of Fig. 6 is eliminated therefrom by applying currents $I_1$ and $I_2$ in the directions shown in Fig. 5B to the $X^11$ and $Y^12$ selection conductors, respectively, of Fig. 6. The elimination of the persistent current flowing in storage loop 85 removes the magnetic field created thereby from link 77 so that the link is returned to the superconductive state or it exhibits a zero resistance. Thereafter, an input signal applied to the X1 conductor 70 may be transmitted through link 77 to the Y2 conductor 73 in the manner described hereinabove with respect to Fig. 2.

It is now clear that in order to permit the transmission of one or more input signals applied to the X conductors to the Y conductors can be performed in the manner described hereinabove with respect to Fig. 2, by selectively controlling the storage loops of Fig. 6 which are to store persistent currents. Although Fig. 6 illustrates a 2 x 3 storage matrix, additional storage loops and the associated links may be provided for each of the rows and columns to be utilized.

It is not intended that the invention be limited by the placement of the X and Y conductors and also the $X^1$ and $Y^1$ selection conductors to the arrangement shown in Fig. 6. For example, the X and Y conductors, such as 70 and 72, may be disposed beneath the adjacent $X^1$ and $Y^1$ selection conductors where the relative field strengths of the magnetic fields produced by the various conductors is taken into account.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. Switching apparatus comprising, a first plurality of conductive members, a second plurality of conductive members, controllable superconductive means individually connecting each member of said first group to each member of said second group to provide an individual current path between each member of said first plurality and each member of said second plurality, persistent current control means for controlling the magnitude of the resistance of each of said superconductive means by applying to the latter a magnetic field thereby impeding current flow therethrough, whereby current pulses applied to one or more members of said first group are conducted through the respective superconductive means having minimum resistance to the corresponding members of said second group.

2. Switching apparatus comprising the combination of: a first plurality of conductors; a second plurality of conductors oriented so that each conductor of said second group traverses all of the conductors of said first group; superconductive means electrically connecting a conductor of said first group and a conductor of said second group at each traversal point for permitting a current applied to one of said conductors to be transmitted through said superconductive means to said other conductor; and means associated with each of said superconductive means for rendering it non-superconductive, whereby individual current pulses simultaneously applied to selected conductors of one of said groups are transmitted through the means remaining superconductive to the associated conductors of the second group.

3. Switching apparatus comprising the combination of a first plurality of conductors; a second plurality of conductors each oriented to traverse all of said first conductors; a plurality of links of superconductive material, each said link electrically interconnecting one of said first conductors to one of said second conductors at the point of traversal; means associated with each of said links for storing a persistent current; and means for controlling the storage of a persistent current in each of said last-mentioned means, whereby the storage of a persistent current renders the associated link non-superconductive thereby impeding current flow therethrough, and whereby current flow is not impeded between said first conductors and said second conductors only where the interconnecting links are in the superconductive state.

4. Switching apparatus comprising, a first group of conductors; a second group of conductors oriented orthogonally to said first group; a plurality of links of superconductive material electrically interconnecting each conductor of said first group with each conductor of said second group; and a plurality of closed current paths each fabricated of superconductive material for storing a persistent current, each said path being located adjacent a predetermined one of said links, whereby a persistent current flowing in one of said paths produces a magnetic field which renders the associated link non-superconductive thereby impeding current flow therethrough, and whereby low impedance connections are established between conductors of said first group and conductors of said second group only at points where the interconnecting links remain superconductive.

5. Switching apparatus comprising: a group of input conductors; a group of output conductors; a plurality of superconductive links; each said link individually connecting one of said input conductors to one of said output conductors to provide an individual current path between each input conductor and each output conductor; pulse means connected to said input conductors operable to simultaneously apply pulses to different ones of said input conductors; and control means for controlling the resistance of each of said superconductive links to cause said pulses to be directed to selected ones of said output conductors; said control means comprising a plurality of loops of superconductor material and means for selectively applying signals thereto effective to selectively establish currents in said loops which persist after said signals are terminated.

6. A switching device for selectively providing interconnections between each of a plurality of input terminals and each of a plurality of output terminals comprising: a plurality of superconductive links; each said link completing a current path between one of said input terminals and one of said output terminals; each of said links being normally in a superconductive state; a plurality of control means, one for each of said links effective when energized to cause the link to be driven into a resistive state; means for selectively energizing said control means to cause certain of said links to be driven resistive and allow others of said links to remain superconductive to cause certain of the input and output terminals to be connected by superconductor links and others of the input and output terminals to be connected by resistive links; and means for applying input pulses to said input terminals which are directed to the output terminals which are connected to the pulsed input terminals by superconductive links.

References Cited in the file of this patent

UNITED STATES PATENTS 2,700,150 Wales ---------------- Jan. 18, 1955

OTHER REFERENCES

"Proceedings of the I.R.E.," April 1956, pp. 482 to 493.